(12) United States Patent
Nomaru et al.

(10) Patent No.: US 9,796,049 B2
(45) Date of Patent: Oct. 24, 2017

(54) LASER PROCESSING APPARATUS

(71) Applicant: DISCO CORPORATION, Tokyo (JP)

(72) Inventors: Keiji Nomaru, Tokyo (JP); Masatoshi Nayuki, Tokyo (JP)

(73) Assignee: Disco Corporation, Tokyo (JP)

( * ) Notice: Subject to any disclaimer, the term of this patent is extended or adjusted under 35 U.S.C. 154(b) by 210 days.

(21) Appl. No.: 14/871,084

(22) Filed: Sep. 30, 2015

(65) Prior Publication Data

US 2016/0096237 A1    Apr. 7, 2016

(30) Foreign Application Priority Data

Oct. 2, 2014  (JP) .................................. 2014-203627

(51) Int. Cl.
  *B23K 26/364*  (2014.01)
  *H01L 21/67*   (2006.01)
  *B23K 26/082*  (2014.01)
  *B23K 103/00*  (2006.01)

(52) U.S. Cl.
  CPC ........ *B23K 26/364* (2015.10); *B23K 26/0821* (2015.10); *B23K 2203/56* (2015.10); *H01L 21/67092* (2013.01)

(58) Field of Classification Search
  CPC ............................... B23K 26/36; H01L 21/67
  USPC ........... 219/121.68, 121.69, 121.83; 438/463
  See application file for complete search history.

(56) References Cited

U.S. PATENT DOCUMENTS

2004/0057044 A1*  3/2004  Nikoonahad .......... G01N 21/94
                                                356/237.2
2004/0254568 A1*  12/2004  Rathjen .............. A61F 9/00827
                                                   606/4

FOREIGN PATENT DOCUMENTS

JP        2005-064231        3/2005

* cited by examiner

*Primary Examiner* — Samuel M Heinrich
(74) *Attorney, Agent, or Firm* — Greer Burns & Crain Ltd.

(57) ABSTRACT

Disclosed herein is a laser processing apparatus including a beam swinging unit provided between a pulsed laser oscillator and a focusing unit for swinging the optical path of a pulsed laser beam oscillated from the pulsed laser oscillator and then introducing the pulsed laser beam to the focusing unit. The beam swinging unit includes a polygon scanner provided on the upstream side of the focusing unit for scanning the pulsed laser beam oscillated from the pulsed laser oscillator and introducing the pulsed laser beam scanned to the focusing unit and an acoustooptic deflecting unit provided on the upstream side of the polygon scanner and on the downstream side of the pulsed laser oscillator for deflecting the optical path of the pulsed laser beam oscillated from the pulsed laser oscillator and introducing the pulsed laser beam deflected to the polygon scanner.

2 Claims, 4 Drawing Sheets

LASER PROCESSING APPARATUS

BACKGROUND OF THE INVENTION

Field of the Invention

The present invention relates to a laser processing apparatus for performing laser processing to a workpiece such as a semiconductor wafer held on workpiece holding means.

Description of the Related Art

In a semiconductor device fabrication process, a plurality of crossing division lines (streets) are formed on the front side of a substantially disk-shaped semiconductor wafer to thereby define a plurality of separate regions where a plurality of devices such as ICs and LSIs are respectively formed. The semiconductor wafer is cut along the division lines to thereby divide the regions where the devices are formed from each other, thus obtaining a plurality of individual semiconductor chips.

In recent years, a semiconductor wafer intended to improve the processing performance of semiconductor chips (devices) such as ICs and LSIs has been put into practical use. This semiconductor wafer is composed of a substrate such as a silicon substrate and a functional layer formed on the front side of the substrate, wherein the functional layer is composed of a low-permittivity insulator film (low-k film) and a functional film formed on the low-k film, the functional film forming a plurality of circuits. Thus, the semiconductor devices are formed from the functional layer. The low-k film is formed from an inorganic film of SiOF, BSG (SiOB), etc. or an organic film such as a polymer film of polyimide, parylene, etc.

Division of such a semiconductor wafer along the division lines is usually performed by using a cutting apparatus called a dicing saw. This cutting apparatus includes a chuck table for holding the semiconductor wafer as a workpiece, cutting means for cutting the semiconductor wafer held on the chuck table, and moving means for relatively moving the chuck table and the cutting means. The cutting means includes a rotating spindle adapted to be rotated at high speeds and a cutting blade mounted on the rotating spindle. The cutting blade is composed of a disk-shaped base and an annular cutting edge mounted on one side surface of the base along the outer circumference thereof. The annular cutting edge is an electroformed diamond blade formed by bonding diamond abrasive grains having a grain size of about 3 μm, for example.

However, it is difficult to cut the low-k film mentioned above by using the cutting blade. That is, the low-k film is very brittle like mica. Accordingly, when the semiconductor wafer having the low-k film is cut along the division lines by using the cutting blade, there arises a problem such that the low-k film may be separated and this separation may reach the devices to cause fatal damage to the devices.

To solve this problem, Japanese Patent Laid-open No. 2005-64231 discloses a wafer dividing method including the steps of applying a laser beam along both sides of each division line on a semiconductor wafer to form two laser processed grooves along each division line, thereby dividing a stacked layer (functional layer) including a stack of low-k films, and next positioning a cutting blade between the two laser processed grooves along each division line to relatively move the cutting blade and the semiconductor wafer, thereby cutting the semiconductor wafer along each division line.

SUMMARY OF THE INVENTION

However, when the laser beam is applied along each division line to remove the stacked layer including the stack of low-k films by ablation, thereby forming the laser processed grooves along each division line, there arises a problem such that fusion debris may scatter from the stacked layer to enter the laser processed grooves. Accordingly, in order to form a laser processed groove having a sufficient width, the laser beam must be applied along each division line plural times, causing a reduction in productivity.

Further, also in a technique of dividing a wafer along division lines by applying a laser beam having an absorption wavelength to the wafer along each division line to form a division groove along each division line by ablation, thereby obtaining a plurality of individual device chips, there arises a problem such that fusion debris may enter the division groove. Accordingly, in order to form a desired division groove necessary for division of the wafer, the laser beam must be applied along each division line plural times, causing a reduction in productivity.

It is therefore an object of the present invention to provide a laser processing apparatus which can efficiently perform ablation.

In accordance with an aspect of the present invention, there is provided a laser processing apparatus including a chuck table for holding a workpiece; a laser beam applying unit for laser-processing the workpiece held on the chuck table; and a moving mechanism for relatively moving the chuck table and the laser beam applying unit; the laser beam applying unit including a pulsed laser oscillator for oscillating a pulsed laser beam, focusing means for focusing the pulsed laser beam oscillated from the pulsed laser oscillator and applying the pulsed laser beam focused to the workpiece held on the chuck table, and a beam swinging unit provided between the pulsed laser oscillator and the focusing means for swinging the optical path of the pulsed laser beam oscillated from the pulsed laser oscillator and then introducing the pulsed laser beam to the focusing means; the beam swinging unit including a polygon scanner provided on the upstream side of the focusing means for scanning the pulsed laser beam oscillated from the pulsed laser oscillator and introducing the pulsed laser beam scanned to the focusing means, and an acoustooptic deflecting unit provided on the upstream side of the polygon scanner and on the downstream side of the pulsed laser oscillator for deflecting the optical path of the pulsed laser beam oscillated from the pulsed laser oscillator and introducing the pulsed laser beam deflected to the polygon scanner, whereby the optical path of the pulsed laser beam is swung by the combination of the deflection of the optical path by the acoustooptic deflecting unit and the deflection of the optical path by the polygon scanner and the pulsed laser beam thus swinging is applied to the workpiece held on the chuck table.

Preferably, the acoustooptic deflecting unit includes first acoustooptic deflecting means for deflecting the optical path of the pulsed laser beam in an X direction and second acoustooptic deflecting means for deflecting the optical path of the pulsed laser beam in a Y direction perpendicular to the X direction.

According to the laser processing apparatus of the present invention, the optical path of the pulsed laser beam is swung by the combination of the deflection of the optical path by the acoustooptic deflecting unit and the deflection of the optical path by the polygon scanner, so that the pulsed laser beam thus swinging is applied to the workpiece held on the chuck table. Accordingly, ablation by the pulsed laser beam is performed overlappingly, so that fusion debris can be prevented from entering the laser processed groove, thereby efficiently forming the laser processed groove in a low-k film, substrate, etc.

Further, in the case of swinging the optical path of the pulsed laser beam in the Y direction by operating the acoustooptic deflecting unit and also swinging the optical path of the pulsed laser beam in the X direction by operating the polygon scanner, a laser processed groove having a desired width can be formed in a low-k film, substrate, etc.

Further, in the case of swinging the optical path of the pulsed laser beam in the X direction by operating the polygon scanner and also swinging the optical path of the pulsed laser beam in the X direction by operating the acoustooptic deflecting unit, it is possible to form a low-density area where the spacing between the pulses is large and a high-density area where the spacing between the pulses is small, that is, the pulses are concentratedly applied. For example, by concentratedly applying the pulsed laser beam at the same position, a hole can be formed.

The manner of application of the pulsed laser beam can be adjusted by changing the rotational speed of the polygon scanner. However, it is difficult to instantaneously adjust the manner of application of the pulsed laser beam due to the effect of inertial force. In contrast thereto, in the laser processing apparatus according to the present invention, the manner of application of the pulsed laser beam can be instantaneously adjusted by operating the acoustooptic deflecting unit to deflect the optical path of the pulsed laser beam without changing the rotational speed of the polygon scanner.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
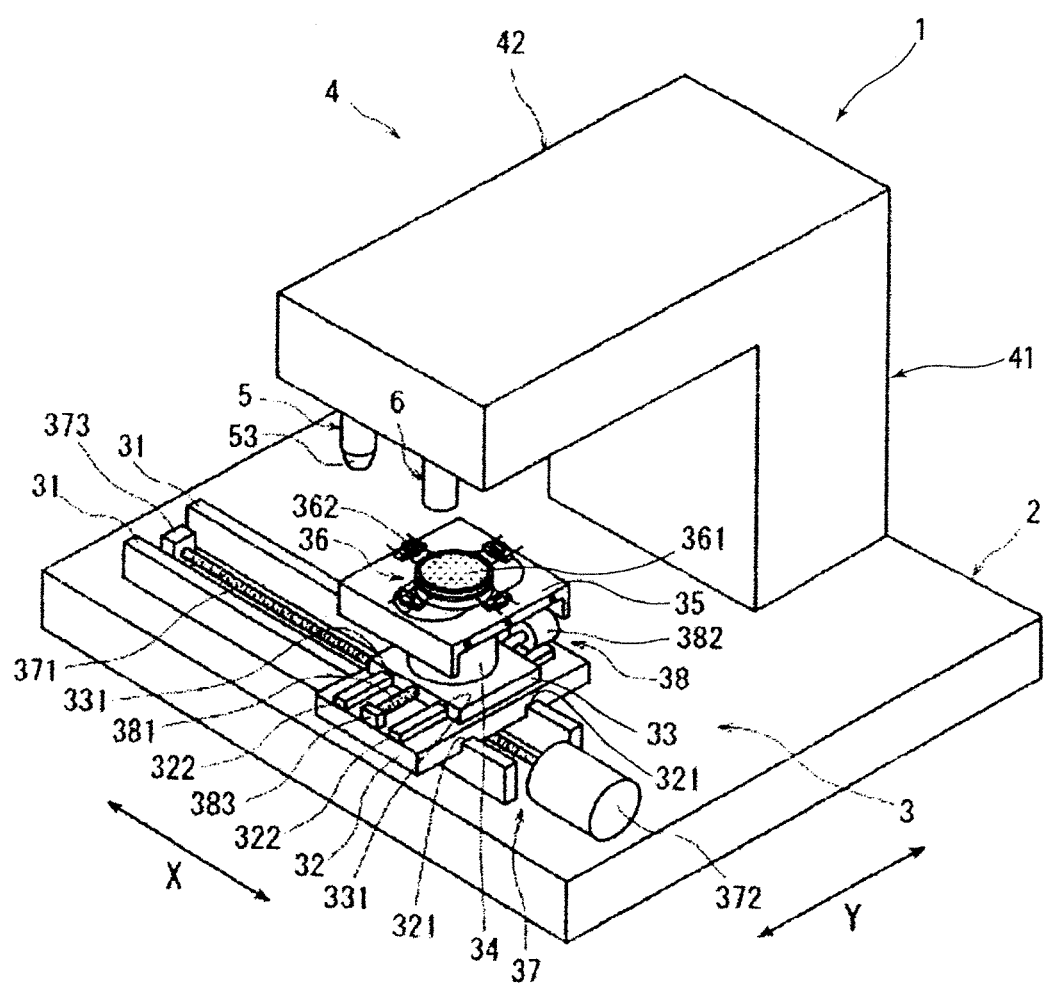
FIG. 1 is a perspective view of a laser processing apparatus according to a preferred embodiment of the present invention.

A preferred embodiment of the laser processing apparatus according to the present invention will now be described in detail with reference to the attached drawings. FIG. 1 is a perspective view of a laser processing apparatus 1 according to this preferred embodiment. The laser processing apparatus 1 shown in FIG. 1 includes a stationary base 2, a chuck table mechanism 3 for holding a workpiece, the chuck table mechanism 3 being provided on the stationary base 2 so as to be movable in a feeding direction (X direction) shown by an arrow X, and a laser beam applying unit 4 provided on the stationary base 2, the laser beam applying unit 4 having laser beam applying means to be hereinafter described in detail.

The chuck table mechanism 3 includes a pair of guide rails 31 provided on the stationary base 2 so as to extend parallel to each other in the X direction, a first slide block 32 provided on the guide rails 31 so as to be movable in the X direction, a second slide block 33 provided on the first slide block 32 so as to be movable in an indexing direction (Y direction) shown by an arrow Y perpendicular to the X direction, a cover table 35 supported by a cylindrical member 34 standing on the second slide block 33, and a chuck table 36 as workpiece holding means. The chuck table 36 has a vacuum chuck 361 formed of a porous material. A workpiece such as a disk-shaped semiconductor wafer is adapted to be held under suction on the upper surface of the vacuum chuck 361 as a holding surface by operating suction means (not shown). The chuck table 36 is rotatable by a pulse motor (not shown) provided in the cylindrical member 34. The chuck table 36 is provided with clamps 362 for fixing an annular frame supporting a semiconductor wafer as the workpiece through a protective tape.

The lower surface of the first slide block 32 is formed with a pair of guided grooves 321 for slidably engaging the pair of guide rails 31 mentioned above. A pair of guide rails 322 are provided on the upper surface of the first slide block 32 so as to extend parallel to each other in the Y direction. Accordingly, the first slide block 32 is movable in the X direction along the guide rails 31 by the slidable engagement of the guided grooves 321 with the guide rails 31. The chuck table mechanism 3 further includes X moving means 37 for moving the first slide block 32 in the X direction along the guide rails 31. The X moving means 37 includes an externally threaded rod 371 extending parallel to the guide rails 31 so as to be interposed therebetween and a pulse motor 372 as a drive source for rotationally driving the externally threaded rod 371. The externally threaded rod 371 is rotatably supported at one end thereof to a bearing block 373 fixed to the stationary base 2 and is connected at the other end to the output shaft of the pulse motor 372 so as to receive the torque thereof. The externally threaded rod 371 is engaged with a tapped through hole formed in an internally threaded block (not shown) projecting from the lower surface of the first slide block 32 at a central portion thereof. Accordingly, the first slide block 32 is moved in the X direction along the guide rails 31 by operating the pulse motor 372 to normally or reversely rotate the externally threaded rod 371.

The lower surface of the second slide block 33 is formed with a pair of guided grooves 331 for slidably engaging the pair of guide rails 322 provided on the upper surface of the first slide block 32 as mentioned above. Accordingly, the second slide block 33 is movable in the Y direction along the guide rails 322 by the slidable engagement of the guided grooves 331 with the guide rails 322. The chuck table mechanism 3 further includes Y moving means 38 for moving the second slide block 33 in the Y direction along the guide rails 322. The Y moving means 38 includes an externally threaded rod 381 extending parallel to the guide rails 322 so as to be interposed therebetween and a pulse motor 382 as a drive source for rotationally driving the externally threaded rod 381. The externally threaded rod 381 is rotatably supported at one end thereof to a bearing block 383 fixed to the upper surface of the first slide block 32 and is connected at the other end to the output shaft of the pulse motor 382 so as to receive the torque thereof. The externally threaded rod 381 is engaged with a tapped through hole formed in an internally threaded block (not shown) projecting from the lower surface of the second slide block 33 at a central portion thereof. Accordingly, the second slide block 33 is moved in the Y direction along the guide rails 322 by operating the pulse motor 382 to normally or reversely rotate the externally threaded rod 381.

The laser beam applying unit 4 includes a support member 41 provided on the stationary base 2, a casing 42 supported by the support member 41 so as to extend in a substantially horizontal direction, laser beam applying means 5 provided on the casing 42, and imaging means 6 provided on the casing 42 at a front end portion thereof for detecting a subject area to be laser-processed. The imaging means 6 includes illuminating means for illuminating the workpiece, an optical system for capturing an area illuminated by the illuminating means, and an imaging device (CCD) for imaging the area captured by the optical system.

The laser beam applying means 5 will now be described with reference to FIGS. 2 and 3. The laser beam applying means 5 includes a pulsed laser oscillator 51, power adjusting means 52 for adjusting the power of a pulsed laser beam oscillated from the pulsed laser oscillator 51, focusing means 53 for focusing the pulsed laser beam adjusted in power by the power adjusting means 52 and applying this pulsed laser beam to the workpiece held on the chuck table 36, and beam swinging means 54 provided between the power adjusting means 52 and the focusing means 53 for swinging the optical path of the pulsed laser beam oscillated from the pulsed laser oscillator 51 and adjusted in power by the power adjusting means 52 and then introducing this pulsed laser beam to the focusing means 53. The pulsed laser oscillator 51 oscillates a pulsed laser beam LB having a wavelength of 355 nm, for example. The focusing means 53 includes a telecentric fθ lens 531 for focusing the pulsed laser beam oscillated from the pulsed laser oscillator 51 and adjusted in power by the power adjusting means 52. The pulsed laser oscillator 51 and the power adjusting means 52 are controlled by control means 7.

The beam swinging means 54 is composed of a pair of first acoustooptic deflecting means 55 and second acoustooptic deflecting means 56 for deflecting the optical path of the pulsed laser beam LB oscillated from the pulsed laser oscillator 51 and adjusted in power by the power adjusting means 52, direction changing means 57 for changing the traveling direction of the pulsed laser beam LB whose optical path has been deflected by the first acoustooptic deflecting means 55 and the second acoustooptic deflecting means 56, and a polygon scanner 58 for scanning the pulsed laser beam LB whose traveling direction has been changed by the direction changing means 57 and then introducing this pulsed laser beam LB to the focusing means 53.

The first acoustooptic deflecting means 55 includes a first acoustooptic device 551 for deflecting the optical path of the pulsed laser beam LB in the X direction in cooperation with the polygon scanner 58, a first RF (radio frequency) oscillator 552 for generating an RF signal to be applied to the first acoustooptic device 551, a first RF amplifier 553 for amplifying the power of the RF signal generated by the first RF oscillator 552 and applying the amplified RF signal to the first acoustooptic device 551, and first deflection angle adjusting means 554 for adjusting the frequency of the RF signal to be generated by the first RF oscillator 552. The first acoustooptic device 551 can adjust the angle of deflection of the optical path of the pulsed laser beam LB according to the frequency of the RF signal applied. The first deflection angle adjusting means 554 is controlled by the control means 7.

The second acoustooptic deflecting means 56 includes a second acoustooptic device 561 for deflecting the optical path of the pulsed laser beam LB in the Y direction perpendicular to the X direction, a second RF oscillator 562 for generating an RF signal to be applied to the second acoustooptic device 561, a second RF amplifier 563 for amplifying the power of the RF signal generated by the second RF oscillator 562 and applying the amplified RF signal to the second acoustooptic device 561, and second deflection angle adjusting means 564 for adjusting the frequency of the RF signal to be generated by the second RF oscillator 562. The second acoustooptic device 561 can adjust the angle of deflection of the optical path of the pulsed laser beam LB according to the frequency of the RF signal applied. The second deflection angle adjusting means 564 is controlled by the control means 7.

Figure 2:
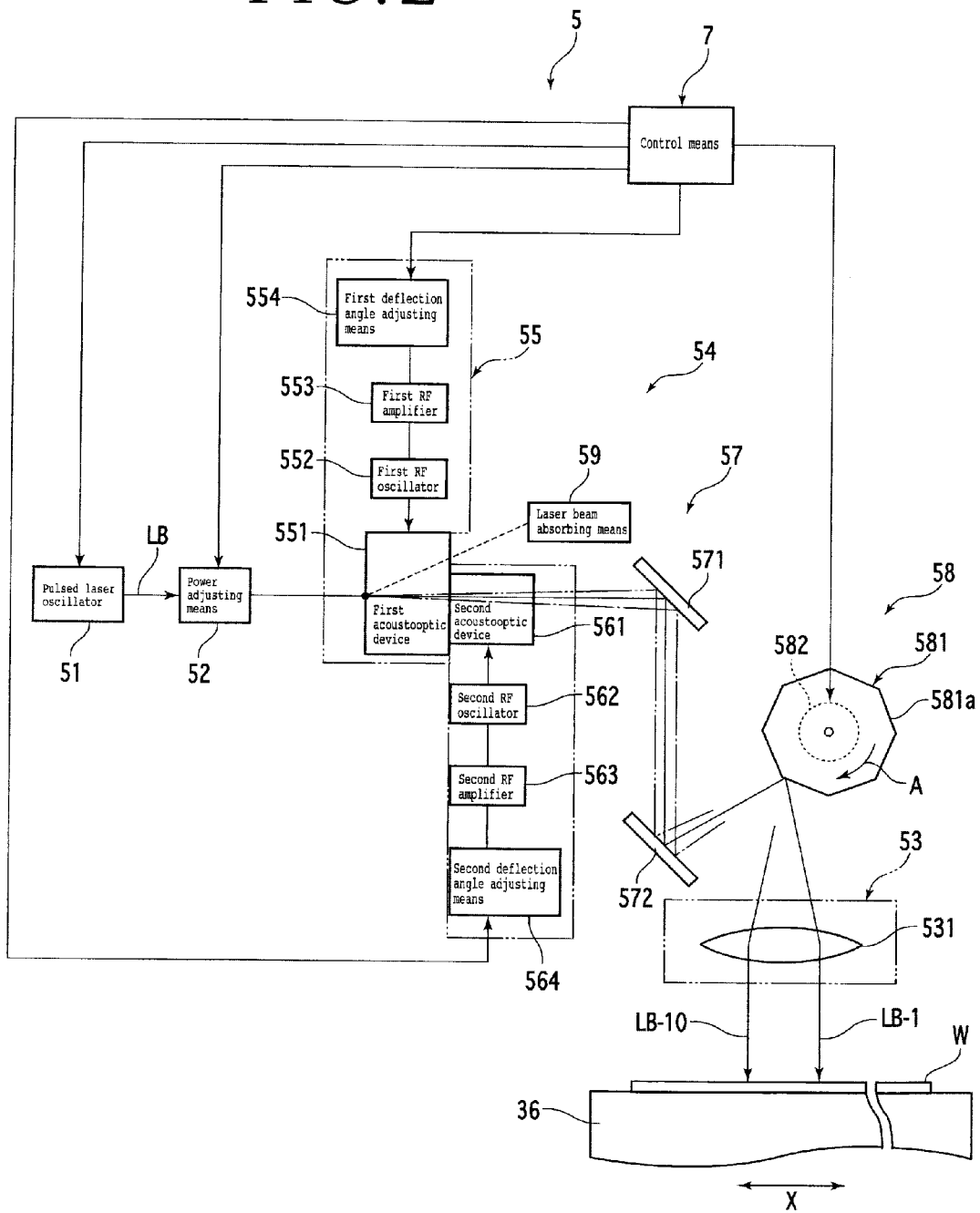
FIG. 2 is a block diagram showing the configuration of laser beam applying means included in the laser processing apparatus shown in FIG. 1.
Figure 3:
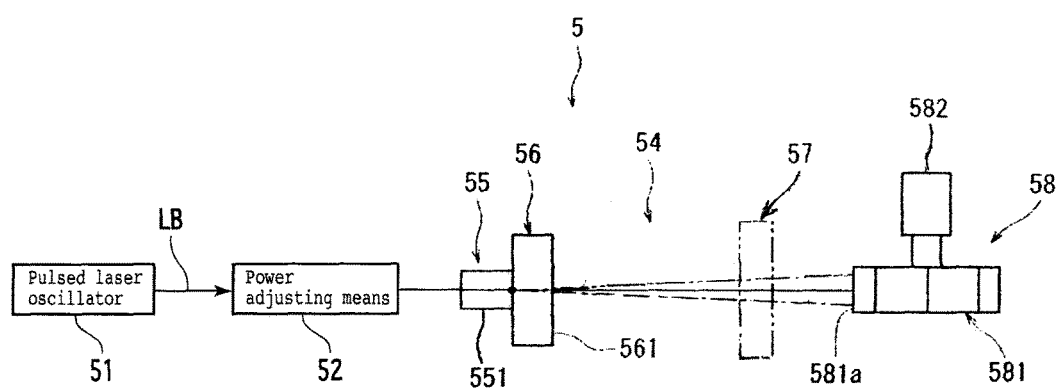
FIG. 3 is a plan view of an essential part of the laser beam applying means shown in FIG. 2.

The laser beam applying means 5 further includes laser beam absorbing means 59 for absorbing the pulsed laser beam LB deflected by the first acoustooptic device 551 as shown by a broken line in FIG. 2 in the case that an RF signal having a predetermined frequency is not applied to the first acoustooptic device 551.

The direction changing means 57 is composed of a first direction changing mirror 571 and a second direction changing mirror 572. The first and second direction changing mirrors 571 and 572 function to change the traveling direction of the pulsed laser beam LB whose optical path has been deflected by the first acoustooptic deflecting means 55 and the second acoustooptic deflecting means 56, thereby introducing the pulsed laser beam LB to the polygon scanner 58. The polygon scanner 58 is composed of a polygon mirror 581 and a scan motor 582 for rotating the polygon mirror 581 in the direction shown by an arrow A in FIG. 2 to thereby scan the pulsed laser beam LB in the X direction. In this preferred embodiment, the polygon mirror 581 has a regular octagonal outer circumference forming eight reflection surfaces 581a. The scan motor 582 of the polygon scanner 58 is controlled by the control means 7.

In the laser processing apparatus 1 described above, the pulsed laser beam LB is applied by the laser beam applying means 5 in the following manner. For example, in the case that the rotational speed of the polygon mirror 581 constituting the polygon scanner 58 is 500 revolutions per second, the moving time of each reflection surface 581a of the polygon mirror 581 is 1/4000 second because the polygon mirror 581 has the eight reflection surfaces 581a. On the other hand, in the case that the repetition frequency of the pulsed laser beam LB oscillated from the pulsed laser oscillator 51 is 40 kHz, the number of pulses of the pulsed laser beam LB to be applied to each reflection surface 581a of the polygon mirror 581 is 10.

As shown in FIG. 2, the pulsed laser beam LB oscillated from the pulsed laser oscillator 51 and adjusted in power by the power adjusting means 52 is introduced to the beam swinging means 54. At this time, a voltage of 10 V, for example, is applied with a predetermined cycle (e.g., 1/4000 second) to the first acoustooptic device 551 by the first deflection angle adjusting means 554 of the first acoustooptic deflecting means 55 controlled by the control means 7. As a result, the pulsed laser beam LB introduced to the beam swinging means 54 is guided through the first and second direction changing mirrors 571 and 572 of the direction changing means 57 to the polygon mirror 581 of the polygon scanner 58 as shown by a solid line in FIG. 2. The polygon mirror 581 is rotated at a predetermined speed (e.g., 500 revolutions per second) in the direction of the arrow A, so that 10 pulses (LB-1 to LB-10) of the pulsed laser beam LB are introduced from each reflection surface 581a of the polygon mirror 581 to the telecentric fθ lens 531 of the focusing means 53 so as to be arranged in the X direction.

On the other hand, a voltage of 5 V to 15 V, for example, is applied with a predetermined cycle (e.g., ¹⁄₄₀₀₀ second) to the second acoustooptic device 561 by the second deflection angle adjusting means 564 of the second acoustooptic deflecting means 56 controlled by the control means 7. As a result, the pulsed laser beam LB oscillated from the pulsed laser oscillator 51 and adjusted in power by the power adjusting means 52 is deflected in the Y direction in the range of 10 pulses (LB-1 to LB-10) and then guided through the direction changing means 57 to the polygon mirror 581 of the polygon scanner 58 as shown in FIG. 3. In this manner, the optical path of the pulsed laser beam LB is swung in the Y direction by the second acoustooptic device 561 by varying the voltage to be applied to the second acoustooptic device 561 by the second deflection angle adjusting means 564 controlled by the control means 7.

Figure 4:
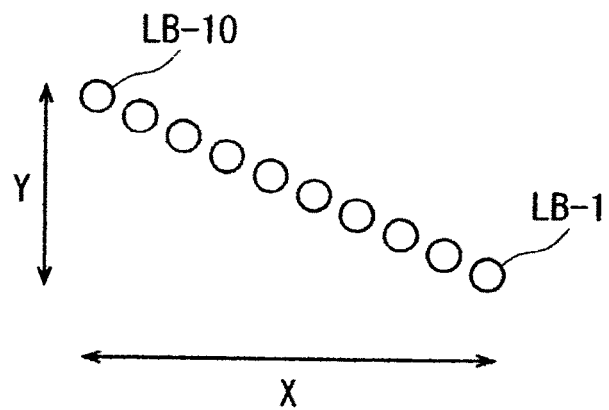
FIG. 4 is a plan view for illustrating the condition of pulses applied to a workpiece in the case that a pulsed laser beam oscillated from a pulsed laser oscillator of the laser beam applying means is swung in a Y direction.

As described above, a predetermined voltage (e.g., 10 V) is applied to the first acoustooptic device 551 by the first deflection angle adjusting means 554 of the first acoustooptic deflecting means 55, and a voltage in a predetermined range (e.g., 5 V to 15 V) is applied to the second acoustooptic device 561 by the second deflection angle adjusting means 564 of the second acoustooptic deflecting means 56. As a result, the pulsed laser beam LB oscillated from the pulsed laser oscillator 51 and adjusted in power by the power adjusting means 52 is deflected by the first acoustooptic deflecting means 55 and then applied through the direction changing means 57, the polygon mirror 581, and the telecentric fθ lens 531 to the workpiece held on the chuck table 36 in such a manner that 10 pulses (LB-1 to LB-10) of the pulsed laser beam LB are arranged in the X direction and deviated from each other in the Y direction in the range of 50 μm, for example, as shown in FIG. 4. In this case, a laser processed groove having a width of 50 μm can be formed.

Figure 5A:
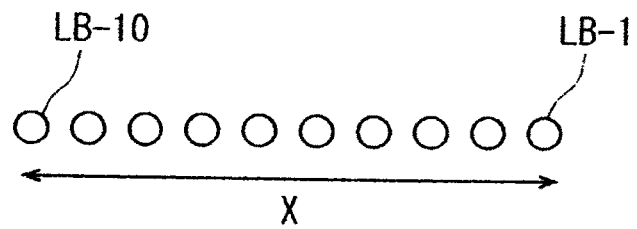
FIGS. 5A and 5B are plan views for illustrating the condition of pulses applied to a workpiece in the case that the pulsed laser beam oscillated from the pulsed laser oscillator is swung in an X direction.

There will now be described another case such that a voltage in a predetermined range (e.g., 5 V to 15 V or 15 V to 5 V) is applied to the first acoustooptic device 551 by the first deflection angle adjusting means 554 of the first acoustooptic deflecting means 55. In the case that a voltage of 5 V to 15 V is applied to the first acoustooptic device 551 with a predetermined cycle (e.g., ¹⁄₄₀₀₀ second), the pulsed laser beam LB oscillated from the pulsed laser oscillator 51 and adjusted in power by the power adjusting means 52 is deflected from a single dot and dash line toward a double dot and dash line shown in FIG. 2. The pulsed laser beam LB thus deflected from the single dot and dash line toward the double dot and dash line is introduced through the direction changing means 57 to the polygon mirror 581. Since the polygon mirror 581 is rotated at a predetermined speed (e.g., 500 revolutions per second) in the direction of the arrow A, the pulsed laser beam LB is introduced to the polygon mirror 581 in such a manner as to be deflected in the same direction as the rotational direction of the polygon mirror 581. As a result, 10 pulses (LB-1 to LB-10) of the pulsed laser beam LB applied through the telecentric fe lens 531 are arranged in the X direction in the condition where the spacing between any adjacent ones of the pulses is large as shown in FIG. 5A.

Figure 5B:
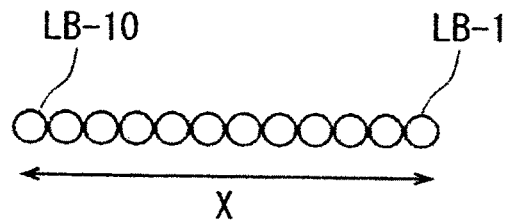

Conversely, in the case that a voltage of 15 V to 5 V is applied to the first acoustooptic device 551 with a predetermined cycle (e.g., ¹⁄₄₀₀₀ second), the pulsed laser beam LB oscillated from the pulsed laser oscillator 51 are adjusted in power by the power adjusting means 52 is deflected from the double dot and dash line toward the single dot and dash line shown in FIG. 2. The pulsed laser beam LB thus deflected from the double dot and dash line toward the single dot and dash line is introduced through the direction changing means 57 to the polygon mirror 581. Since the polygon mirror 581 is rotated at a predetermined speed (e.g., 500 revolutions per second) in the direction of the arrow A, the pulsed laser beam LB is introduced to the polygon mirror 581 in such a manner as to be deflected in the direction opposite to the rotational direction of the polygon mirror 581. As a result, 10 pulses (LB-1 to LB-10) of the pulsed laser beam LB applied through the telecentric fθ lens 531 are arranged in the X direction in the condition where the spacing between any adjacent ones of the pulses is small as shown in FIG. 5B.

In the laser beam applying means 5 according to this preferred embodiment described above, the optical path of the pulsed laser beam is swung by the combination of the deflection of the optical path by the first acoustooptic deflecting means 55 and the second acoustooptic deflecting means 56 and the deflection of the optical path by the polygon scanner 58, so that the pulsed laser beam thus swinging is applied to the workpiece held on the chuck table 36. Accordingly, ablation by the pulsed laser beam is performed overlappingly in the X direction, so that fusion debris can be prevented from entering the laser processed groove, thereby efficiently forming the laser processed groove in a low-k film, substrate, etc.

Further, in the case of swinging the optical path of the pulsed laser beam in the Y direction by operating the second acoustooptic deflecting means 56 and also swinging the optical path of the pulsed laser beam in the X direction by operating the polygon scanner 58, a laser processed groove having a desired width can be formed in a low-k film, substrate, etc.

Further, in the case of swinging the optical path of the pulsed laser beam in the X direction by operating the polygon scanner 58 and also swinging the optical path of the pulsed laser beam in the X direction by operating the first acoustooptic deflecting means 55, it is possible to form a low-density area where the spacing between the pulses is large and a high-density area where the spacing between the pulses is small, that is, the pulses are concentratedly applied. For example, by concentratedly applying the pulsed laser beam at the same position, a hole can be formed.

The manner of application of the pulsed laser beam can be adjusted by changing the rotational speed of the polygon mirror 581 constituting the polygon scanner 58. However, it is difficult to instantaneously adjust the manner of application of the pulsed laser beam due to the effect of inertial force. In contrast thereto, in the laser beam applying means 5 according to this preferred embodiment, the manner of application of the pulsed laser beam can be instantaneously adjusted by operating the first acoustooptic deflecting means 55 and the second acoustooptic deflecting means 56 to deflect the optical path of the pulsed laser beam without changing the rotational speed of the polygon mirror 581.

The present invention is not limited to the details of the above described preferred embodiment. The scope of the invention is defined by the appended claims and all changes and modifications as fall within the equivalence of the scope of the claims are therefore to be embraced by the invention.

What is claimed is:
1. A laser processing apparatus comprising:
a chuck table for holding a workpiece;
a laser beam applying unit for laser-processing said workpiece held on said chuck table; and
a moving mechanism for relatively moving said chuck table and said laser beam applying unit;

said laser beam applying unit including
- a pulsed laser oscillator for oscillating a pulsed laser beam,
- focusing means for focusing said pulsed laser beam oscillated from said pulsed laser oscillator and applying said pulsed laser beam focused to said workpiece held on said chuck table, and
- a beam swinging unit provided between said pulsed laser oscillator and said focusing means for swinging an optical path of said pulsed laser beam oscillated from said pulsed laser oscillator and then introducing said pulsed laser beam to said focusing means; said beam swinging unit including
    - a polygon scanner provided on the upstream side of said focusing means for scanning said pulsed laser beam oscillated from said pulsed laser oscillator and introducing said pulsed laser beam scanned to said focusing means, and
    - an acoustooptic deflecting unit provided on the upstream side of said polygon scanner and on the downstream side of said pulsed laser oscillator for deflecting the optical path of said pulsed laser beam oscillated from said pulsed laser oscillator and introducing said pulsed laser beam deflected to said polygon scanner, whereby the optical path of said pulsed laser beam is swung by the combination of the deflection of the optical path by said acoustooptic deflecting unit and the deflection of the optical path by said polygon scanner and said pulsed laser beam thus swinging is applied to said workpiece held on said chuck table.

2. The laser processing apparatus according to claim 1, wherein said acoustooptic deflecting unit includes first acoustooptic deflecting means for deflecting the optical path of said pulsed laser beam in an X direction and second acoustooptic deflecting means for deflecting the optical path of said pulsed laser beam in a Y direction perpendicular to said X direction.

* * * * *